United States Patent
Shiga

(10) Patent No.: US 8,331,147 B2
(45) Date of Patent: Dec. 11, 2012

(54) NONVOLATILE SEMICONDUCTOR MEMORY DEVICE

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 12/838,811

(22) Filed: Jul. 19, 2010

(65) Prior Publication Data

US 2011/0044103 A1      Feb. 24, 2011

(30) Foreign Application Priority Data

Aug. 20, 2009   (JP) ................................. 2009-191420

(51) Int. Cl.
G11C 11/34 (2006.01)
G11C 16/04 (2006.01)
(52) U.S. Cl. .......... 365/185.03; 365/185.09; 365/189.05
(58) Field of Classification Search ......... 365/185.03 O, 365/185.08, 185.09 X, 189.011, 189.05 X, 365/185.03, 185.09, 189.05
See application file for complete search history.

(56) References Cited

U.S. PATENT DOCUMENTS

| | | | |
|---|---|---|---|
| 6,985,388 B2 * | 1/2006 | Cernea | 365/189.05 |
| 7,106,623 B2 * | 9/2006 | Hung et al. | 365/163 |
| RE40,110 E | 2/2008 | Shibata et al. | |
| 7,525,839 B2 | 4/2009 | Shibata et al. | |
| 7,589,997 B2 | 9/2009 | Honma et al. | |
| 7,768,841 B2 * | 8/2010 | Cernea | 365/189.05 |
| 2008/0055990 A1 | 3/2008 | Ishikawa et al. | |
| 2010/0124110 A1 | 5/2010 | Shiga et al. | |

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A nonvolatile semiconductor memory device comprises: a memory cell array configured by a plurality of first and second lines and a plurality of memory cells, each of the memory cells being selected by the first and second lines and being configured to store multiple-bit data in a nonvolatile manner; a data bus configured to transmit write data to be written to the plurality of memory cells, the write data being configured by a plurality of unit data; a column selection unit configured by a plurality of data latches, each of the data latches being configured to directly receive the unit data inputted from the data bus and to retain the unit data; and a control unit configured to control activation/non-activation of the data latches. During a programming operation, for each unit data inputted to the column selection unit, the control unit activates one of the data latches corresponding to a certain one of the memory cells where the unit data is to be stored.

20 Claims, 15 Drawing Sheets

US 8,331,147 B2

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-191420, filed on Aug. 20, 2009, the entire contents of which are incorporated herein by reference.

BACKGROUND OF THE INVENTION

1. Field of the Invention

The present invention relates to a nonvolatile semiconductor memory device.

2. Description of the Related Art

In recent years, multilevel technology, in which a plurality of threshold value states are assigned to one memory cell to enable storage of multiple bits of information in the memory cell, has become standard as a way of realizing increased capacity in nonvolatile memory.

However, this multilevel technology results in a reduction in the gap between threshold distributions used to express data. Consequently, misreading of a memory cell resulting from the threshold distribution of the memory cell being mistakenly written to a different position to the desired position due to, for example, malfunction of the memory cell or application of an excessive write voltage, occurs more easily.

To deal with this problem, there is a nonvolatile memory provided with an error detection and correction function using ECC (Error Correcting Code) aimed at improving reliability of data. Such nonvolatile memory requires generation of redundant ECC data based on data supplied by the host, and configuration of an ECC frame. This results in the problem of an increased burden of system processing, whereby system performance cannot be fully displayed.

SUMMARY OF THE INVENTION

In accordance with an aspect of the present invention, a nonvolatile semiconductor memory device comprises: a memory cell array configured by a plurality of first and second lines and a plurality of memory cells, each of the memory cells being selected by the first and second lines and being configured to store multiple-bit data in a nonvolatile manner; a data bus configured to transmit write data to be written to the plurality of memory cells, the write data being configured by a plurality of unit data; a column selection unit configured by a plurality of data latches, each of the data latches being configured to directly receive the unit data inputted from the data bus and to retain the unit data; and a control unit configured to control activation/non-activation of the data latches, wherein, during a programming operation, for each unit data inputted to the column selection unit, the control unit activates one of the data latches corresponding to a certain one of the memory cells where the unit data is to be stored.

DETAILED DESCRIPTION OF THE EMBODIMENTS

Embodiments of a nonvolatile semiconductor memory device in accordance with the present invention are described in detail below with reference to the drawings.

First Embodiment

A nonvolatile memory in accordance with a first embodiment of the present invention is configured by a NAND flash memory.

Figure 1:
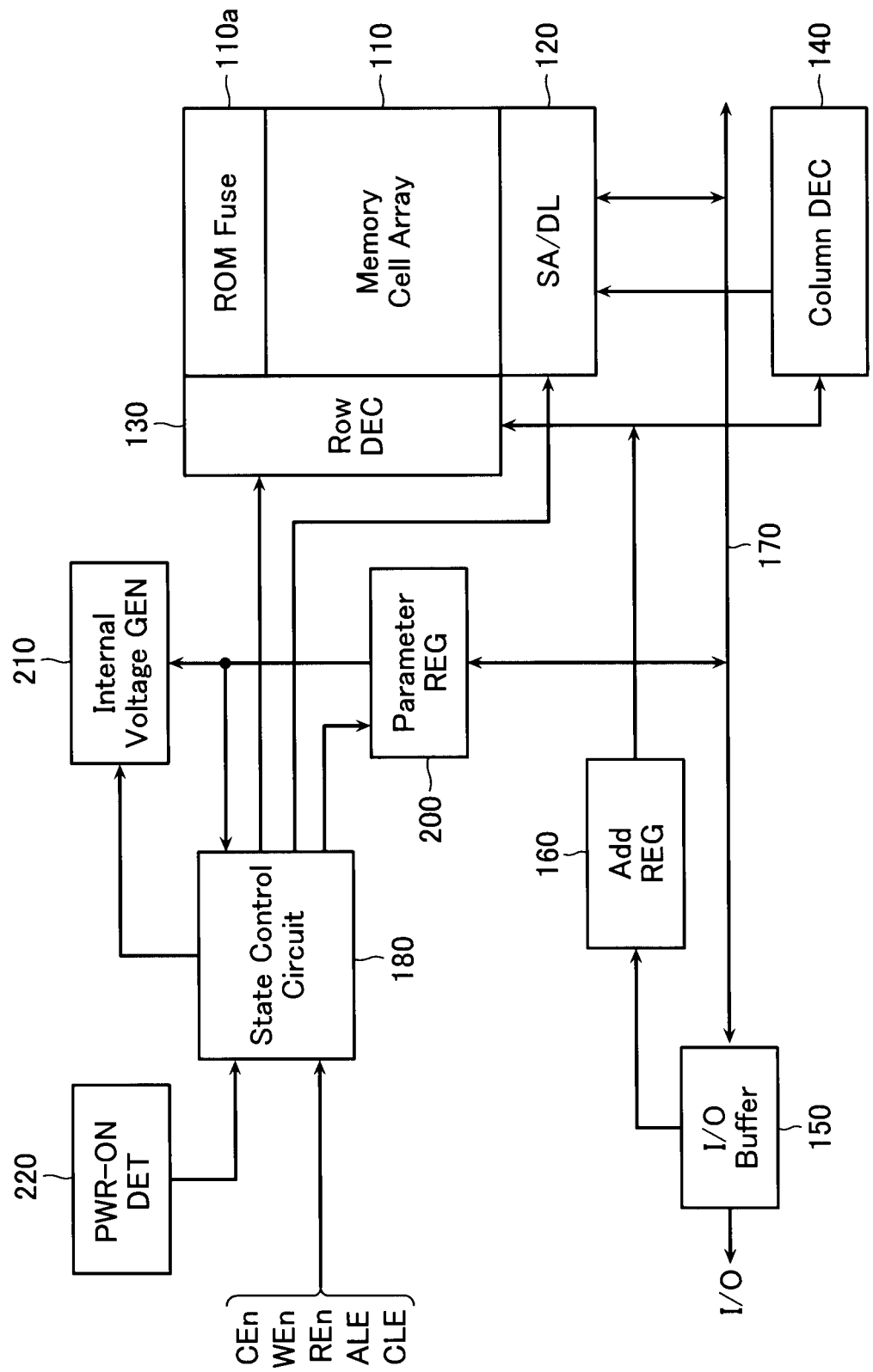
FIG. 1 is a view showing a functional block configuration of a nonvolatile memory in accordance with a first embodiment.
Figure 2:
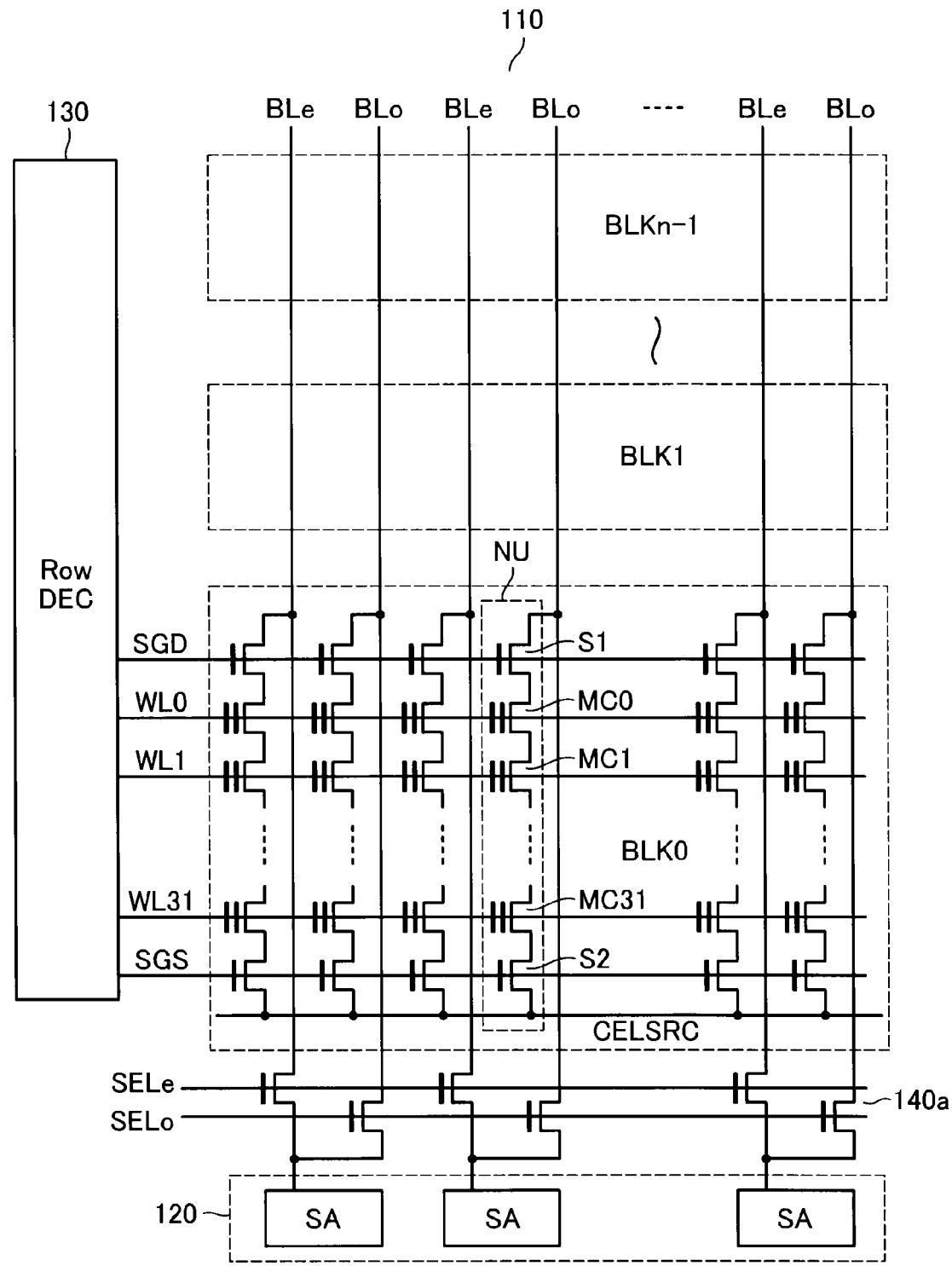
FIG. 2 is a view showing a configuration of a memory cell array in the same nonvolatile memory.

FIG. 1 shows a functional block configuration of the NAND flash memory, and FIG. 2 shows a configuration of a memory cell array 110 in the NAND flash memory. The memory cell array 110 is configured as an arrangement of NAND cell units (NAND strings) NU, as shown in FIG. 2.

Each of the NAND cell units NU includes a plurality (32 in the example in FIG. 2) of memory cells MC0-MC31 connected in series. The NAND cell unit NU has one end connected via a select gate transistor S1 to a bit line BLe (or BLo) which is a first line, and the other end connected via a select gate transistor S2 to a cell source line CELSRC.

Each of the control gates of the memory cells MC0-MC31 is respectively connected to a different one of word lines WL0-WL31 each of which is a second line, and gates of the select gate transistors S1 and S2 are connected to select gate lines SGD and SGS.

Disposed at one end of the bit line BL is a sense amplifier/data latch unit 120 which is part of a column control unit. In the example in FIG. 2, an adjacent even-numbered bit line BLe and odd-numbered bit line BLo share a sense amplifier SA, and are selectively connected to the sense amplifier SA by a selection circuit 140a. In this case, the set of memory cells selected by one word line WL and all even-numbered bit lines BLe (or all odd-numbered bit lines BLo) configures a "page" which is a unit of data access during simultaneous write/read.

Note that in the description below, "page" is used to refer not only to "page" in this sense of a unit of data access, but also to indicate a hierarchy of stored data when storing multilevel data in a single memory cell MC, that is, to indicate a stage in programming. In this case, "page" is sometimes referred to as "physical page", or L (Lower) page, M (Middle) page, U (Upper) page, and so on. Moreover, "page" is also used to indicate a certain size of information data inputted from external, the certain size being a size subject to a single ECC frame to be described hereafter. In this case, "page" is sometimes referred to as "logical page", or 1st page, 2nd page, 3rd page, and so on.

A set of NAND cell units NU arranged in a word line WL direction configures a block, the block forming a basic unit of data erase. A plurality of blocks BLK (BLK0, BLK1, . . . , BLKn–1) are arranged in a bit line BL direction. A row decoder 130 is disposed to selectively drive the word lines WL and select gate lines SGD and SGS.

During read, one page of read data read out to the sense amplifier/data latch unit 120 is selected in column units by a column decoder 140 which is part of the column control unit, and is thereby outputted via a data bus 170 and an I/O buffer 150 to external.

During write, write data inputted from an I/O port is loaded via the I/O buffer 150 and the data bus 170 into the sense amplifier/data latch unit 120. Subsequent to loading three pages worth of physical pages of this write data, programming to the memory cells MC is executed.

Addresses inputted from external are transferred via an address register 160 to the row decoder 130 and the column decoder 140. Commands inputted from external are decoded in a state control circuit 180 which is a control unit.

The state control circuit 180 performs sequence control for write and erase or read control in accordance with the commands and external timing control signals (chip enable signal CEn, write enable signal WEn, read enable signal REn, address latch enable signal ALE, command latch enable signal CLE, and so on).

The present nonvolatile memory comprises an internal voltage generating circuit 210 for generating required voltages appropriate to operation modes. This internal voltage generating circuit 210 is controlled by the state control circuit 180. Moreover, the present nonvolatile memory comprises a ROM fuse region 110a and a power-on detecting circuit 220. The ROM fuse region 110a constitutes a region for storing various voltages obtained by a wafer test, and adjustment data of timings (initial setting data), as well as a programming voltage initial value. This adjustment data is set in a parameter register 200 using timings of power-on detected by the power-on detecting circuit 220, and subsequently utilized in various operation controls.

Figure 3:
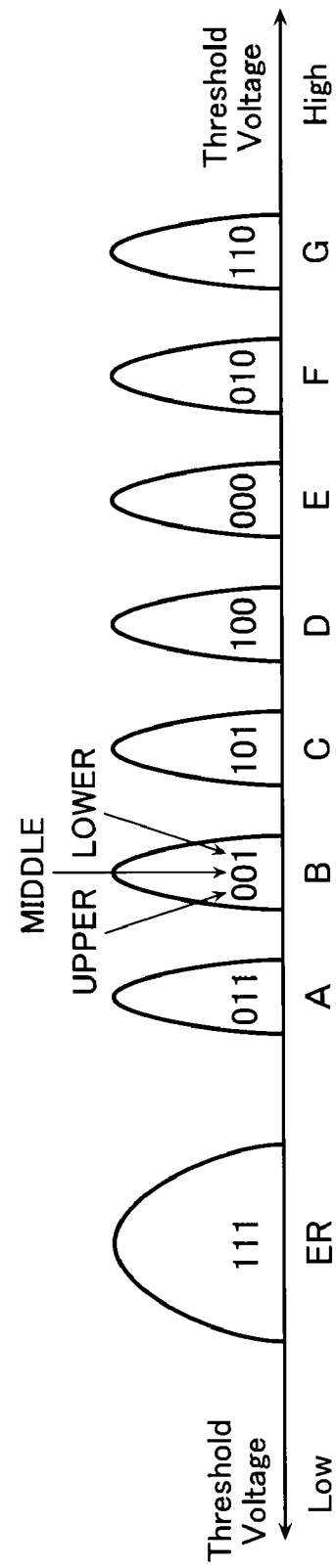
FIG. 3 is a view showing threshold distributions and a bit allocation pattern for each threshold distribution during 8-level storage in the same nonvolatile memory.

FIG. 3 is a view showing threshold distributions and a bit allocation pattern for each threshold distribution during 8-level (3-bit) storage in the nonvolatile memory in accordance with the present embodiment.

As shown in FIG. 3, the threshold distribution is divided into eight threshold levels, from a threshold level ER having a lowest threshold voltage (erase state of the memory cell MC) to a threshold level G having a highest threshold voltage. These threshold levels ER, A, B, C, D, E, F, and G correspond to binary data "111", "011", "001", "101", "100", "000", "010", and "110", respectively. Note that the three bits of data retained in the memory cell MC correspond to bits which configure, respectively from a high-order bit, a U (UPPER) page, M (MIDDLE) page, and L (LOWER) page.

Next, a programming operation of the memory cell MC is described.

Figure 4:
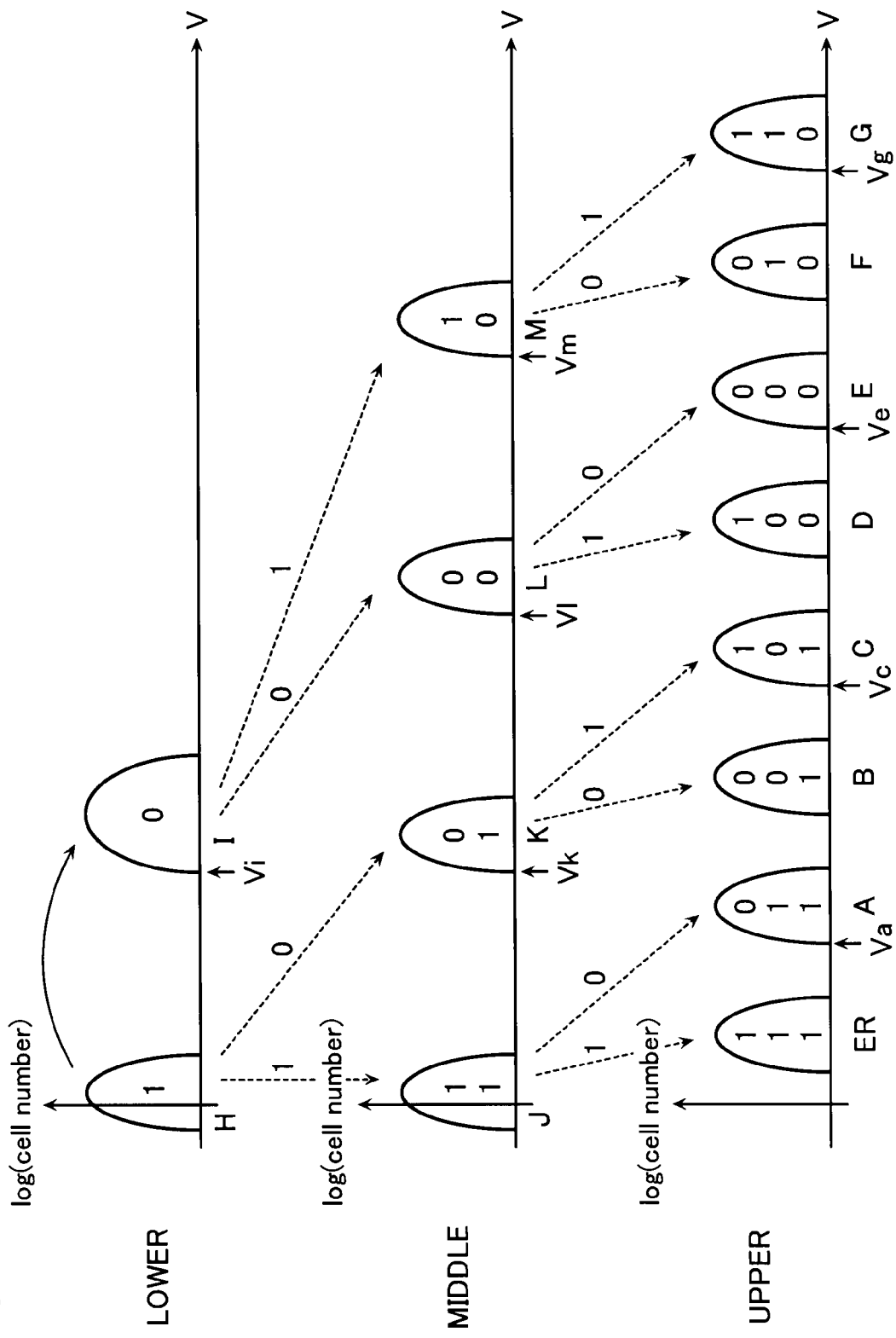
FIG. 4 is a view explaining a programming operation based on the bit allocation pattern shown in FIG. 3.

FIG. 4 is a view showing changes in the threshold distribution during a programming operation based on the bit allocation pattern shown in FIG. 3.

As shown in FIG. 4, the programming operation is performed in order of L page, M page, and U page.

Programming of the L page has the memory cell MC at erase-state threshold level H applied with write data "0" and "1". When write data is "0", the threshold voltage is elevated to a threshold level I, and when write data is "1", the threshold voltage is maintained unchanged. The threshold level I for write data "0" is determined by a verify voltage V1 set to a lower limit value of the distribution. This allows the "0" and "1" of the L page to be programmed.

Programming of the M page comprises selective programming of "0" to the memory cell MC at erase-state threshold level H (=J) (programming to a threshold level K), and selective programming of "0" and "1" to the memory cell MC at threshold level I (programming to a threshold level L in the case of "0" and to a threshold level M in the case of "1"). It should be noted here that, in the case of FIG. 4, although "0" is write data causing the threshold voltage to vary, it is not always the case that "1" is non-write data. As in this example, programming that greatly shifts the threshold is sometimes performed even in the case that data is "1". Program voltage application operations for these three kinds of programming of the M page are simultaneous, but verify operations are performed under different conditions. That is, the verify operations using verify voltages Vk, Vl, and Vm to confirm the threshold levels K, L, and M are performed with different timings.

Programming of the U page is performed as a selective programming of "0" to the memory cell MC at threshold level J (programming to the threshold level A), a selective programming of "0" or "1" to the memory cell MC at threshold level K (programming to the threshold level B in the case of "0" and to the threshold level C in the case of "1"), a selective programming of "1" or "0" to the memory cell MC at threshold level L (programming to the threshold level D in the case of "1" and to the threshold level E in the case of "0"), and a selective programming of "0" or "1" to the memory cell MC at threshold level M (programming to the threshold level F in the case of "0" and to the threshold level G in the case of "1"). Likewise for programming of this U page, program voltage application operations are simultaneous, but verify operations are performed under conditions of differing verify voltages, that is, using verify voltages Va-Vg.

As is clear from the above, when storing multiple bits in a single memory cell MC, each of the threshold distributions becomes narrowed and, as a result, may not achieve its correct threshold distribution depending on programming characteristics of each of the memory cells MC. Error detection and correction using ECC are thus performed during data read. In this case, it is necessary for the NAND flash memory to have a region for retaining redundant data of ECC as well as the information data inputted from the host. This leads to access of data being performed on an ECC frame basis, the ECC frame being configured by one page worth of data (for example, 8 KB) and this redundant data.

Next, the kind of format used to store the information data inputted from external in the memory cell array 110 is described.

Before describing the case of the present embodiment, a number of comparative examples are described.

Figure 13:
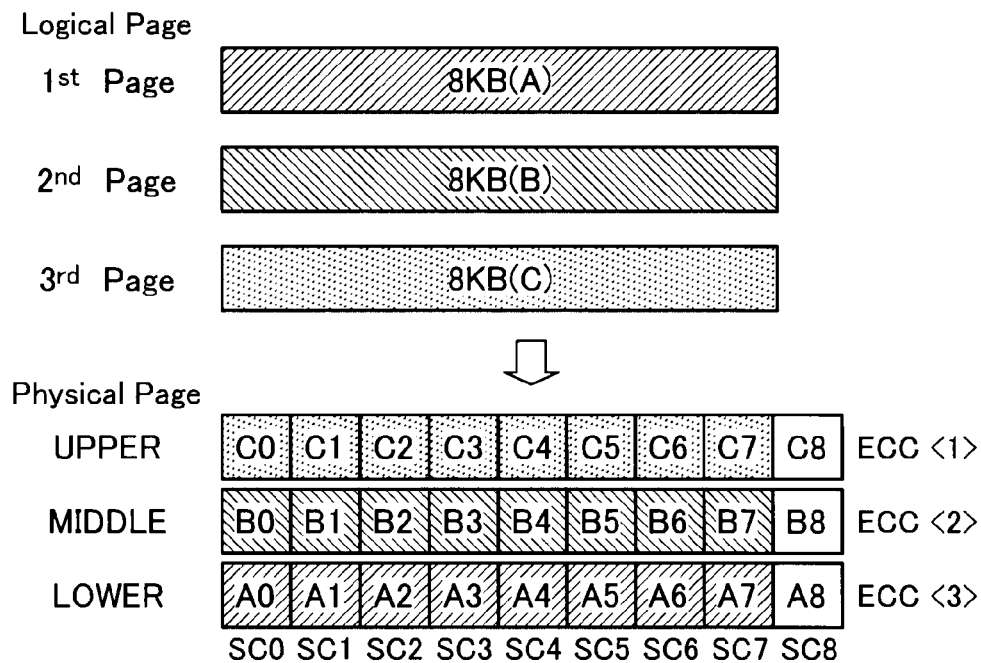
FIG. 13 is a view showing a relationship between data format of a logical page and a physical page in a nonvolatile memory in accordance with a first comparative example.

FIG. 13 is a view showing a relationship between data format of a logical page and a physical page in a NAND flash memory in accordance with a first comparative example.

The information data inputted from the host is treated on a logical page basis, the logical page being configured in a certain size. In the case of FIG. 13, the logical page has three pages, namely, the 1st page comprising data A, the 2nd page comprising data B, and the 3rd page comprising data C, each of the three pages being configured to have a size of 8 KB.

The physical page has three pages, namely, the U page, the M page, and the L page, formed from a certain number of memory cells MC connected to one of the word lines WL, each of the three pages being divided into a plurality of sections SC. The number of sections SC is arbitrary, but for simplicity of description, each of the pages is here assumed to be divided into nine sections SC0-SC8. Furthermore, in the description below, the sections SCi (i=0-8) in each of the U page, M page, and L page are expressed as <Ui>, <Mi>, and <Li>, respectively.

In the case of the present comparative example, ECC frames, each configured by the information data forming the original data and the redundant data of ECC calculated on the basis of this information data, are generated on a logical page basis. Specifically, in the case of the 1st page, an ECC frame <1> is generated which is configured by eight items of information data A0-A7 from the 8 KB of data A and redundant data A8 calculated from the data A. Similarly, an ECC frame <2> configured by information data B0-B7 and redundant data B8 and an ECC frame <3> configured by information data C0-C7 and redundant data C8 are generated respectively from the 2nd page and 3rd page. A0-C8 and so on, which are units of data transfer, are here referred to as "unit data".

These generated ECC frames <1>, <2>, and <3> are stored, as is, in the L page, M page, and U page, respectively. More specifically, for example, data A0-A8 of the ECC frame <1> is stored in sections <L0-L8>.

Figure 14:
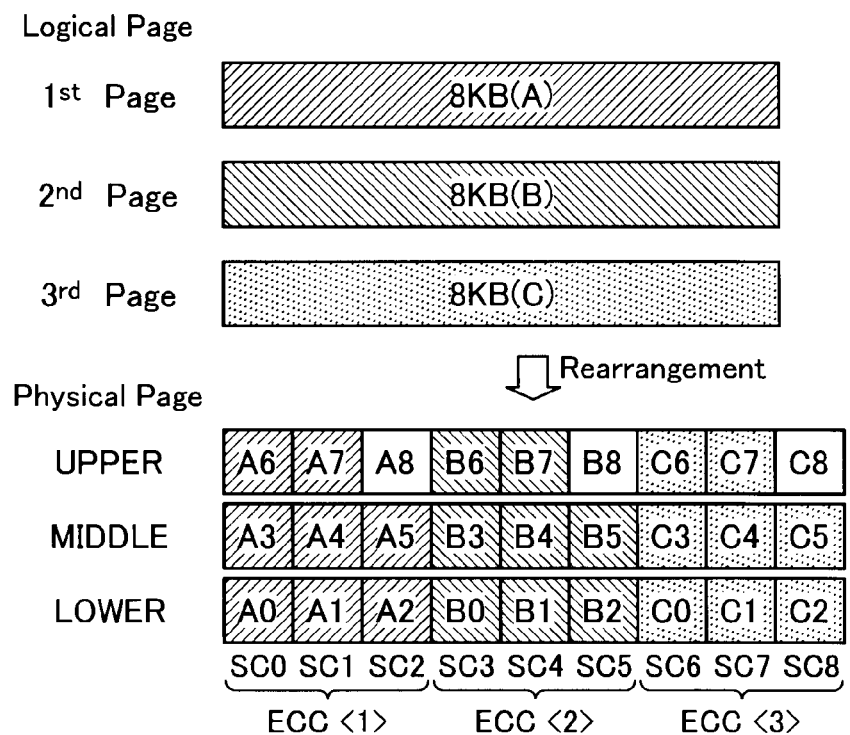
FIG. 14 is a view showing a relationship between data format of a logical page and a physical page in a nonvolatile memory in accordance with a second comparative example.

FIG. 14 is a view showing a relationship between data format of a logical page and a physical page in a second comparative example.

FIG. 14 is similar to the first example in that the ECC frames are generated on a logical page basis, but differs in that the ECC frames are stored dispersed among the U page, M page, and L page. Specifically, the ECC frames <1>, <2>, and <3> are stored in sections <L0-L2, M0-M2, U0-U2>, <L3-L5, M3-M5, U3-U5>, and <L6-L8, M6-M8, U6-U8>, respectively.

Now, as is clear from FIG. 3, while miswrite of data occurs easily between adjacent threshold levels, such as between threshold levels A and B, or B and C, it is rare for a miswrite of data to occur between separated threshold levels, for example, between threshold levels ER and D. It can be understood from this that, in the case of the bit allocation shown in FIG. 3, miswrite in the U page occurs more easily than miswrite in the other pages. Moreover, when only one memory cell MC is considered, it is rare for an error to occur in data of two or more physical pages from among the U page, M page, and L page, but, for example, even if there are errors present only in the U page of the memory cell MC, when there are a plurality of such memory cells MC, this leads to a plurality of miswrite data existing in the totality of U pages. It can be understood from this that error detection and correction using ECC is more likely to be improved by storing the ECC frame dispersed between the U page, M page, and L page as in the second comparative example shown in FIG. 14 than by storing the ECC frame unchanged in a single physical page as in the first comparative example shown in FIG. 13.

Next, a method for realizing the data format shown in FIG. 14 is described.

Figure 15:
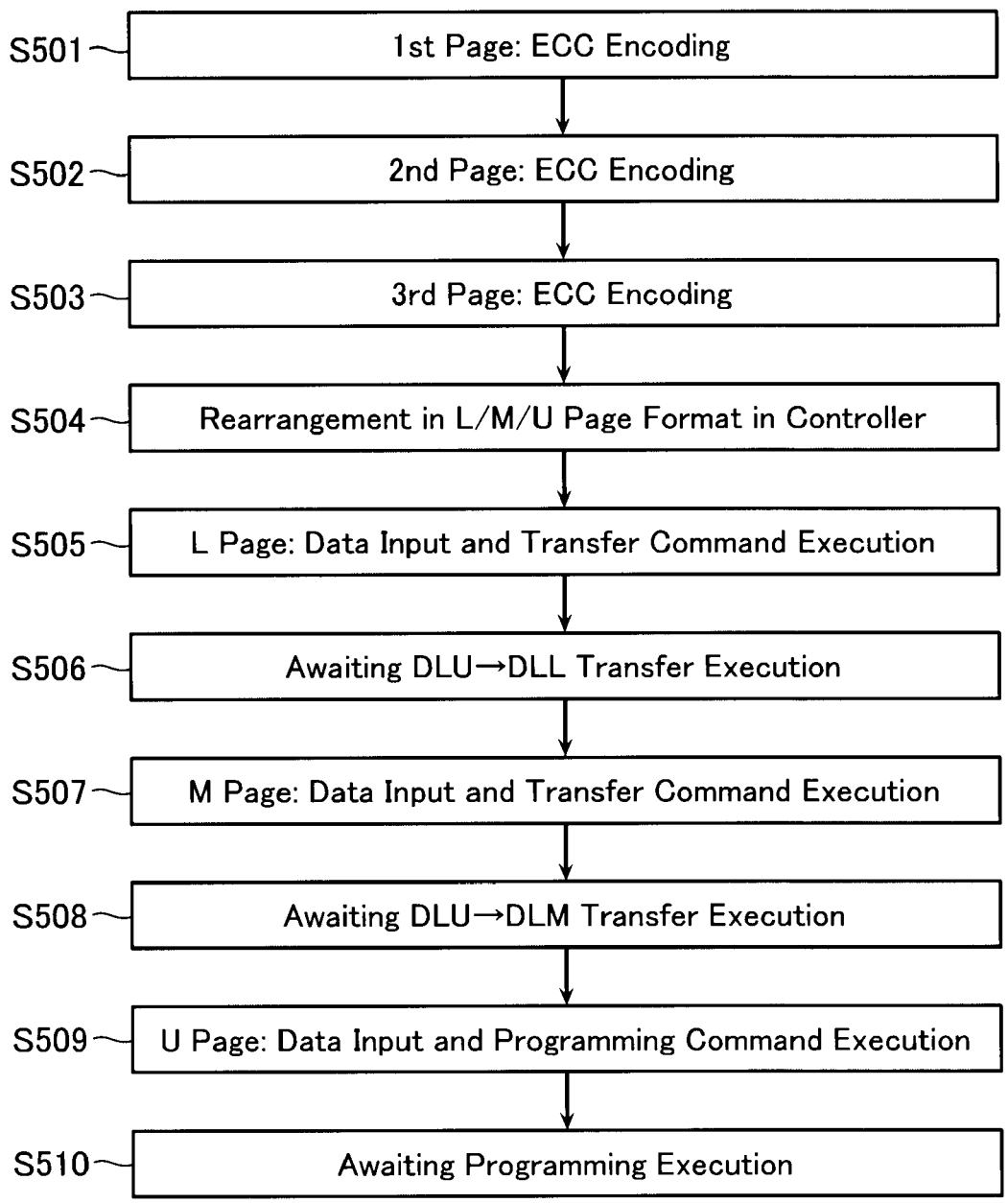
FIG. 15 is a view showing a control flow for realizing the data format shown in FIG. 14.
Figure 16:
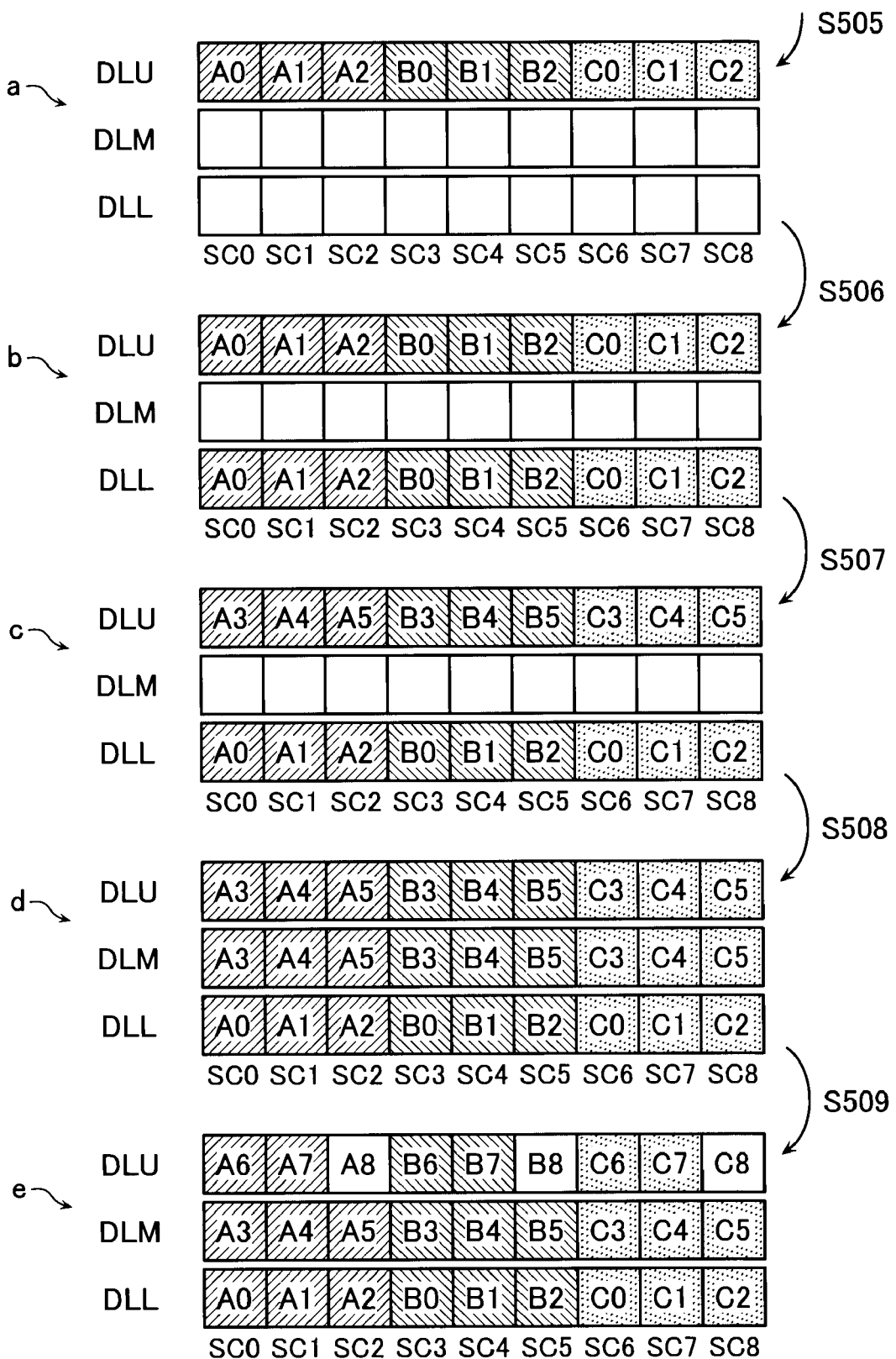
FIG. 16 is a view showing a state of data latches on a step-by-step basis for the control flow shown in FIG. 15.

FIG. 15 is a control flow for realizing the data format shown in FIG. 14, and FIG. 16 is a view showing a state of data latches in this control flow. Now, the control flow in FIG. 15 assumes a general sense amplifier/data latch unit. Specifically, the sense amplifier/data latch unit comprises three data latches DLU, DLM, and DLL for retaining write data to be written to the U page, M page, and L page, respectively. The sense amplifier/data latch unit is structured such that, of these data latches, only the data latch DLU is capable of receiving write data from the data bus 170, and the other data latches DLM and DLL have write data transferred to them via the data latch DLU.

First, in step S501, ECC encoding of data A of the 1st page is performed in-system or in a cache memory controller chip. This results in generation of the information data A0-A7 and the redundant data A8.

Subsequently, in step S502, ECC encoding of data B of the 2nd page is performed in-system or in a cache memory controller chip. This results in generation of the information data B0-B7 and the redundant data B8.

Then, in step S503, ECC encoding of data C of the 3rd page is performed in-system or in a cache memory controller chip. This results in generation of the information data C0-C7 and the redundant data C8.

Next, in step S504, the information data and redundant data generated in steps S501-S503 is rearranged in-system or in a cache memory controller chip so as to conform with the data format shown in FIG. 14. The L page data comprising data A0-A2, B0-B2, and C0-C2, the M page data comprising data A3-A5, B3-B5, and C3-C5, and the U page data comprising data A6-A8, B6-B8, and C6-C8 are thereby respectively prepared.

Then, in step S505, the data A0-A2, B0-B2, and C0-C2 which is that data of the data rearranged through step S504 stored in the L page, is transferred to the sense amplifier/data latch unit and retained in the data latch DLU. The state of the data latches DLU, DLM, and DLL at this time is shown in a of FIG. 16. Subsequently, in step S506, the L page data stored in the data latch DLU is transferred to the data latch DLL. The state of the data latches DLU, DLM, and DLL at this time is shown in b of FIG. 16.

Then, in step S507, the data A3-A5, B3-B5, and C3-C5 which is that data of the data rearranged through step S504 stored in the M page, is transferred to the sense amplifier/data latch unit and retained in the data latch DLU. The state of the data latches DLU, DLM, and DLL at this time is shown in c of FIG. 16. Subsequently, in step S508, the M page data stored in the data latch DLU is transferred to the data latch DLM. The state of the data latches DLU, DLM, and DLL at this time is shown in d of FIG. 16.

Then, in step S509, the data A6-A8, B6-B8, and C6-C8 which is that data of the data rearranged through step S504 stored in the U page, is transferred to the sense amplifier/data latch unit and retained in the data latch DLU. The state of the data latches DLU, DLM, and DLL at this time is shown in e of FIG. 16.

Finally, in step S510, the data retained in the data latches DLU, DLM, and DLL is programmed to the U page, M page, and L page, respectively.

The above allows the data format shown in FIG. 14 to be realized.

Figure 17:
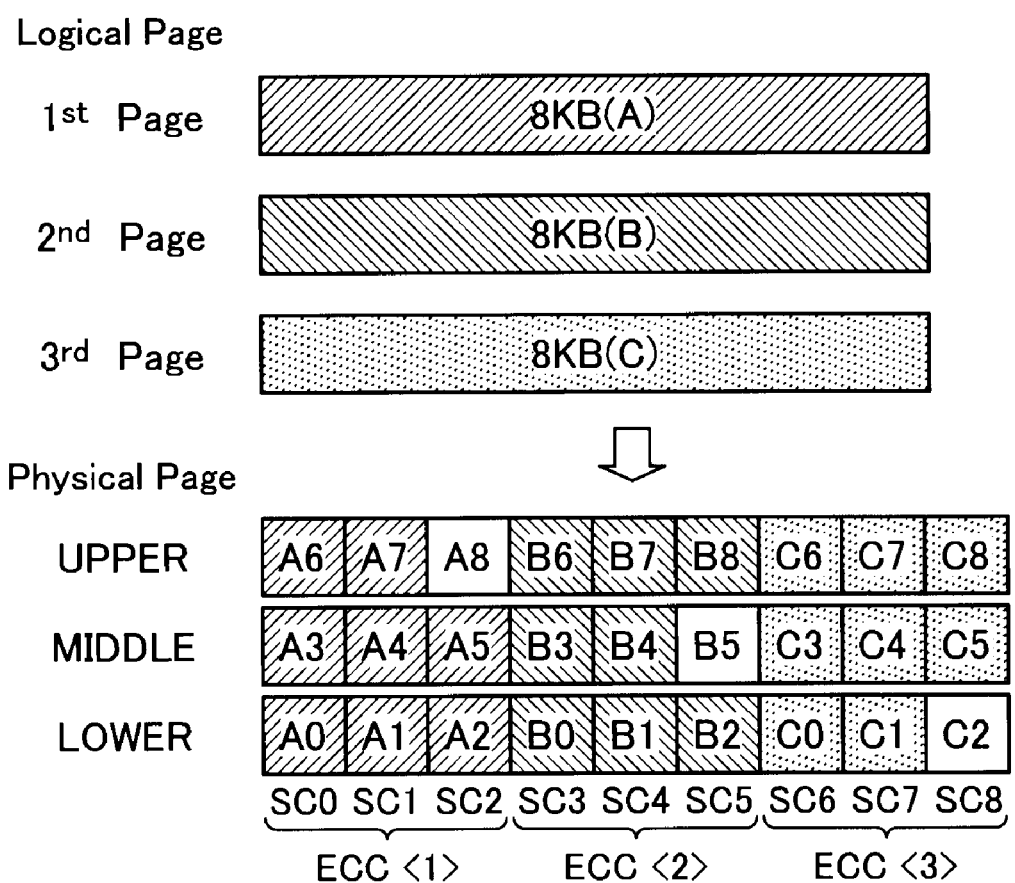
FIG. 17 is a view showing a relationship between data format of a logical page and a physical page in a nonvolatile memory in accordance with a third comparative example.

Note that although, in the case of the second comparative example, the ECC redundant data A8, B8, and C8 is all stored in the U page, the redundant data may be stored in any of the physical pages. For example, in the case of a third comparative example shown in FIG. 17, the redundant data A8 of data A, the redundant data B5 of data B, and the redundant data C2 of data C are stored in sections <U2>, <M5>, and <L8>, respectively. Even this kind of data format can be realized by the control flow shown in FIG. 15, since only a rearrangement sequence in-system or in a cache memory controller chip is changed.

As shown above, in the case of the second and third comparative examples, highly efficient and reliable ECC error detection and correction is made possible by having the ECC frame dispersed among the U page, M page, and L page physical pages.

However, since the control flow shown in FIG. 15 requires data rearrangement processing in-system or in a cache memory controller chip, the system load increases, leading to the problem that overall system processing capacity cannot be sufficiently assured.

Accordingly, the present embodiment aims to improve overall system processing capacity by omitting such in-system data rearrangement processing.

Figure 5:
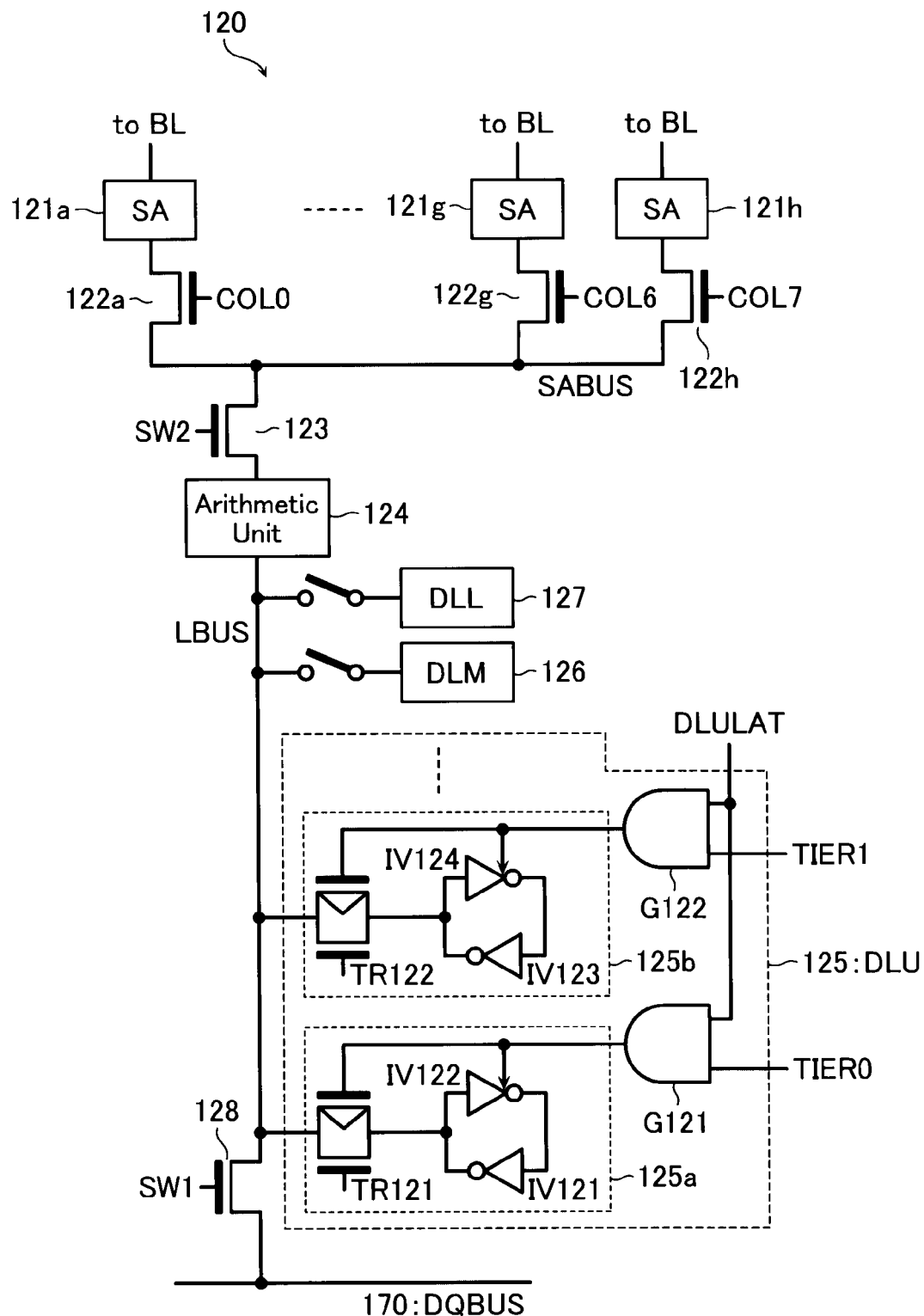
FIG. 5 is a view showing a configuration of a sense amplifier/data latch unit in the present nonvolatile memory.

FIG. 5 is a view showing a configuration of the sense amplifier/data latch unit 120 in accordance with the first embodiment of the present invention. This sense amplifier/data latch unit 120 is compatible with an I/O interface performing data input/output in one byte units.

The sense amplifier/data latch unit 120 comprises eight sense amplifiers 121a-121h each provided to one end of one of the bit lines BL of the memory cell array 110, an arithmetic unit 124 for performing data transfer between the memory cell array 110 and external and for performing arithmetic required at the time of the data transfer, and data latches 125 (DLU), 126 (DLM), and 127 (DLL). Transmitting and receiving of data between the plurality of sense amplifiers 121 and the arithmetic unit 124 is performed via a sense amplifier bus SABUS. A plurality of switch elements 122a-122h are provided between the sense amplifiers 121a-121h and the sense amplifier bus SABUS, the switch elements 122a-122h being controlled by column select signals COL0-COL7, respectively. Meanwhile, a switch element 123 is provided between the arithmetic unit 124 and the sense amplifier bus SABUS, the switch element 123 being controlled by a second switch signal SW2. Moreover, transmitting and receiving of data between the arithmetic unit 124 and the data latches 125-127 and a data bus DQBUS (170) is performed via a local bus LBUS. The three data latches 125-127 and the local bus LBUS are connected by switch elements. A switch element 128 is provided between the data bus DQBUS and the local bus LBUS, the switch element 128 being controlled by a first switch signal SW1.

The data latch 125 comprises eight, in other words one byte's worth, of bit latch circuits 125a-125h (125c-125h not shown). The bit latch circuit 125a comprises a flip-flop circuit and a transfer transistor TR121, the flip-flop circuit including two inverters IV121 and IV122 having their inputs and outputs connected to each other, and the transfer transistor TR121 being a switch element configured to connect the flip-flop circuit and the local bus LBUS. In addition, the bit latch circuit 125a comprises an AND gate G121 having as inputs a data latch signal DLULAT for activating the data latch 125, and a bit select signal TIER0 for activating the bit latch circuit 125a. The bit latch circuit 125a is controlled by output of the AND gate G121. This results, in other words, in the bit latch circuit 125a being activated and connected to the local bus LBUS only when both the data latch signal DLULAT and the bit select signal TIER0 are activated.

The other bit latch circuits 125b-125h of the data latch 125 are configured similarly. Moreover, the data latches 126 and 127 are configured similarly to the data latch 125.

The arithmetic unit 124 is required to perform complex processing and therefore becomes large in size. As a result, FIG. 5 has a configuration where one arithmetic unit 124 is shared by a plurality of columns (bit lines BL). In this case, during 8-bit data transfer between the sense amplifiers 121 and the arithmetic unit 124, the column select signals COL0-COL7 must be activated sequentially to perform the data transfer by time division. Note that when chip area and so on is not a problem, a plurality of arithmetic units 124 may be provided. In this case, data transfer time between the sense amplifiers 121 and the arithmetic unit 124 can be reduced.

Next, a programming operation of the ECC frame in the present embodiment comprising the sense amplifier/data latch unit 120 is described. Here, data format in a logical page and a physical page shown in FIG. 6 is described by way of example.

This data format is also similar to the second and third comparative examples in having the ECC frame configured on a logical page basis, and in having the ECC frame stored by dispersing the ECC frame among the U page, M page, and L page. However, the position of data in the physical page within each of the ECC frames is different. Specifically, the ECC frame <1> is configured by information data A0-A7 and redundant data A8, and the respective data A0, A1, ..., A8 are stored in a section <L0, M0, U0, L1, M1, U1, L2, M2, U2>. The ECC frame <2> is configured by information data B0-B7 and redundant data B8, and the respective data B0, B1, ..., B8 are stored in a section <L3, M3, U3, L4, M4, U4, L5, M5, U5>. The ECC frame <3> is configured by information data C0-C7 and redundant data C8, and the respective data C0, C1, ..., C8 are stored in a section <L6, M6, U6, L7, M7, U7, L8, M8, U8>.

Figure 6:
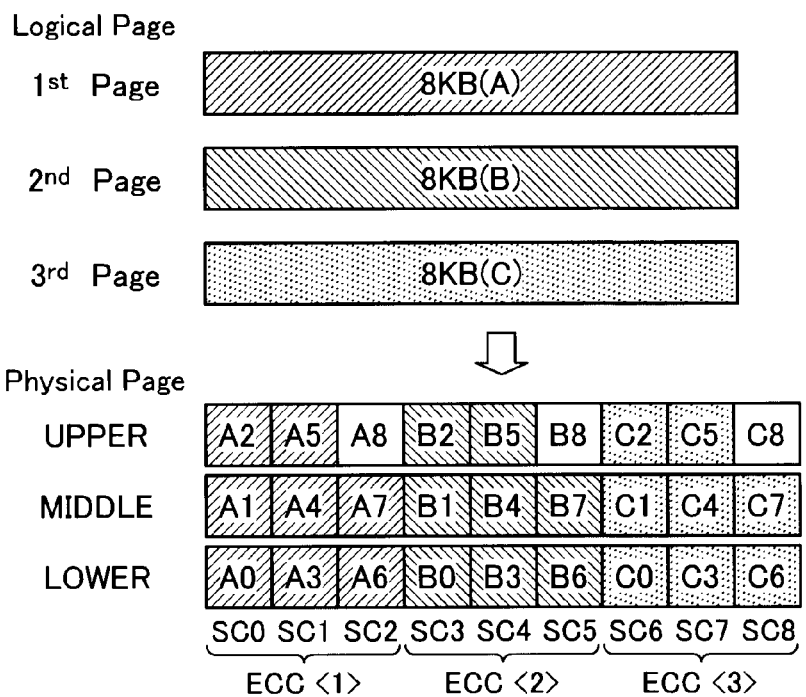
FIG. 6 is a view showing a relationship between data format of a logical page and a physical page in the same nonvolatile memory.
Figure 7:
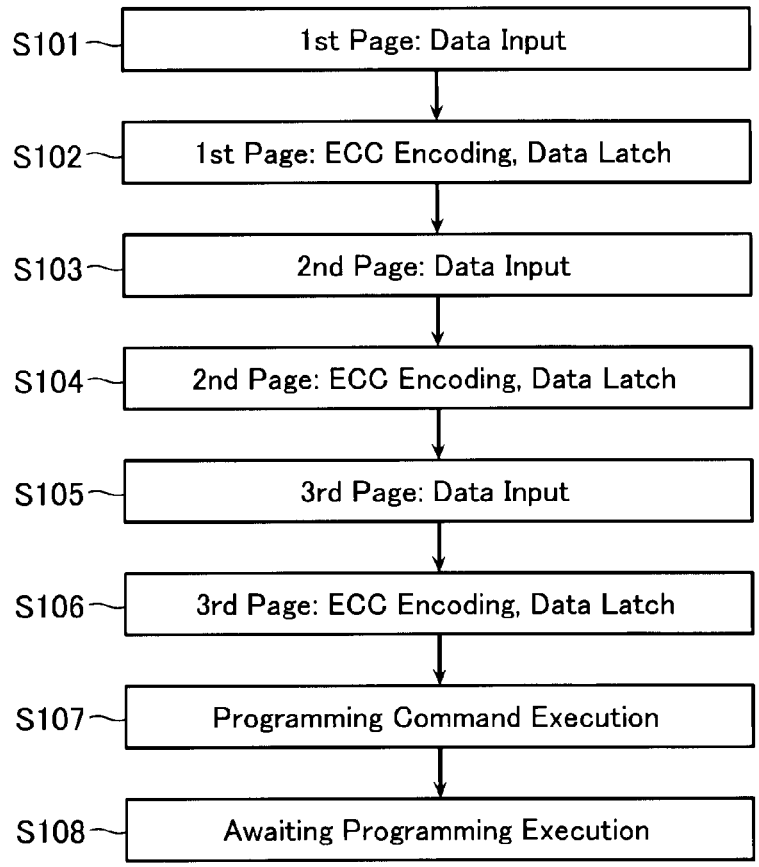
FIG. 7 is a view showing a control flow for realizing the data format shown in FIG. 6.
Figure 8:
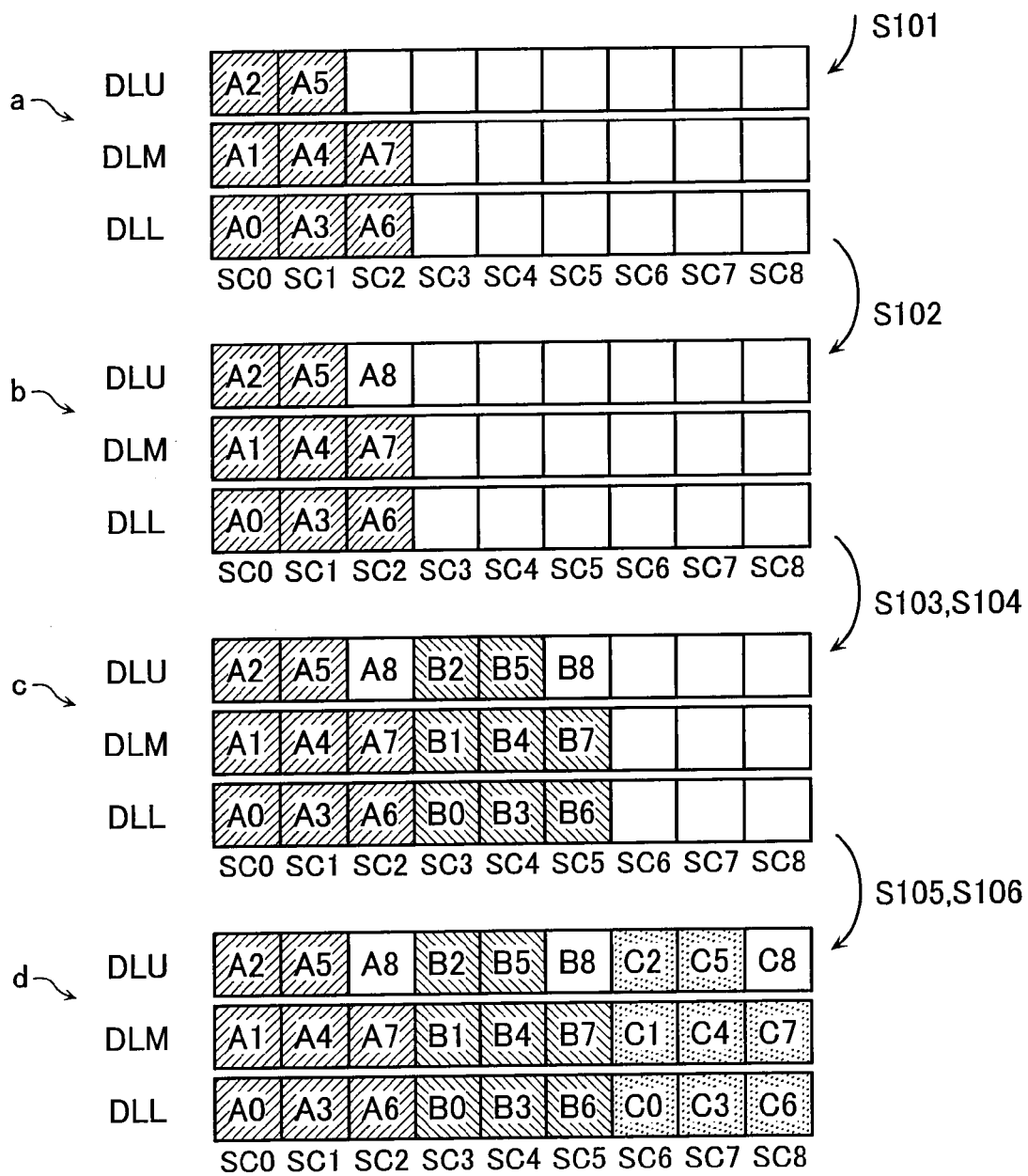
FIG. 8 is a view showing a state of data latches on a step-by-step basis for the control flow shown in FIG. 7.

When using the above-mentioned sense amplifier/data latch unit 120 shown in FIG. 5, the data format shown in FIG. 6 can be realized by a control flow shown in FIG. 7. FIG. 8 is a view showing a state of the data latches DLU, DLM, and DLL in the control flow shown in FIG. 7.

First, in step S101, data A of the 1st page is inputted as information data A0-A7 into the sense amplifier/data latch unit 120. Meanwhile, in step S102, redundant data A8 is generated in-system or in a cache memory controller chip, and this redundant data A8 is inputted into the sense amplifier/data latch unit 120 following input of the information data A7. In the sense amplifier/data latch unit 120, the data latch signals DLLLAT, DLMLAT, and DLULAT applied to match timing of input of the data A0, A1, A2, ..., A6, A7, A8 are used to activate the data latches DLL, DLM, and DLU in the order of DLL, DLM, DLU, ..., DLL, DLM, DLU and thereby receive the data A0-A8. States of the data latches DLU, DLM, and DLL subsequent to steps S101 and S102 are shown respectively in a and b of FIG. 8.

Next, in step S103, data B of the 2nd page is inputted as information data B0-B7 into the sense amplifier/data latch unit 120. Meanwhile, in step S104, redundant data B8 is generated in-system or in a cache memory controller chip, and this redundant data B8 is inputted into the sense amplifier/data latch unit 120 following input of the information data B7. In the sense amplifier/data latch unit 120, the data latch signals DLLLAT, DLMLAT, and DLULAT applied to match timing of input of the data B0, B1, B2, . . . , B6, B7, B8 are used to activate the data latches DLL, DLM, and DLU in the order of DLL, DLM, DLU, . . . , DLL, DLM, DLU and thereby receive the data B0-B8. A state of the data latches DLU, DLM, and DLL subsequent to step S104 is shown in c of FIG. 8.

Then, in step S105, data C of the 3rd page is inputted as information data C0-C7 into the sense amplifier/data latch unit 120. Meanwhile, in step S106, redundant data C8 is generated in-system or in a cache memory controller chip, and this redundant data C8 is inputted into the sense amplifier/data latch unit 120 following input of the information data C7. In the sense amplifier/data latch unit 120, the data latch signals DLLLAT, DLMLAT, and DLULAT applied to match timing of input of the data C0, C1, C2, . . . , C6, C7, C8 are used to activate the data latches DLL, DLM, and DLU in the order of DLL, DLM, DLU, . . . , DLL, DLM, DLU and thereby receive the data C0-C8. A state of the data latches DLU, DLM, and DLL subsequent to step S106 is shown in d of FIG. 8.

Subsequently, in step S107, a programming command is executed on the memory cell array 110, and, finally, in step S108, completion of this programming is awaited.

In the case of the present embodiment, data rearrangement processing performed in-system or in a cache memory controller chip during the programming operation is unnecessary and the write data can be inputted directly into the NAND flash memory. This allows the present embodiment to have a performance in error detection and correction using ECC which is equivalent to that of the second and third comparative examples, while at the same time allowing system processing in the present embodiment to be reduced compared to the second and third comparative examples, thereby allowing provision of a nonvolatile memory having improved system performance.

Second Embodiment

Figure 9:
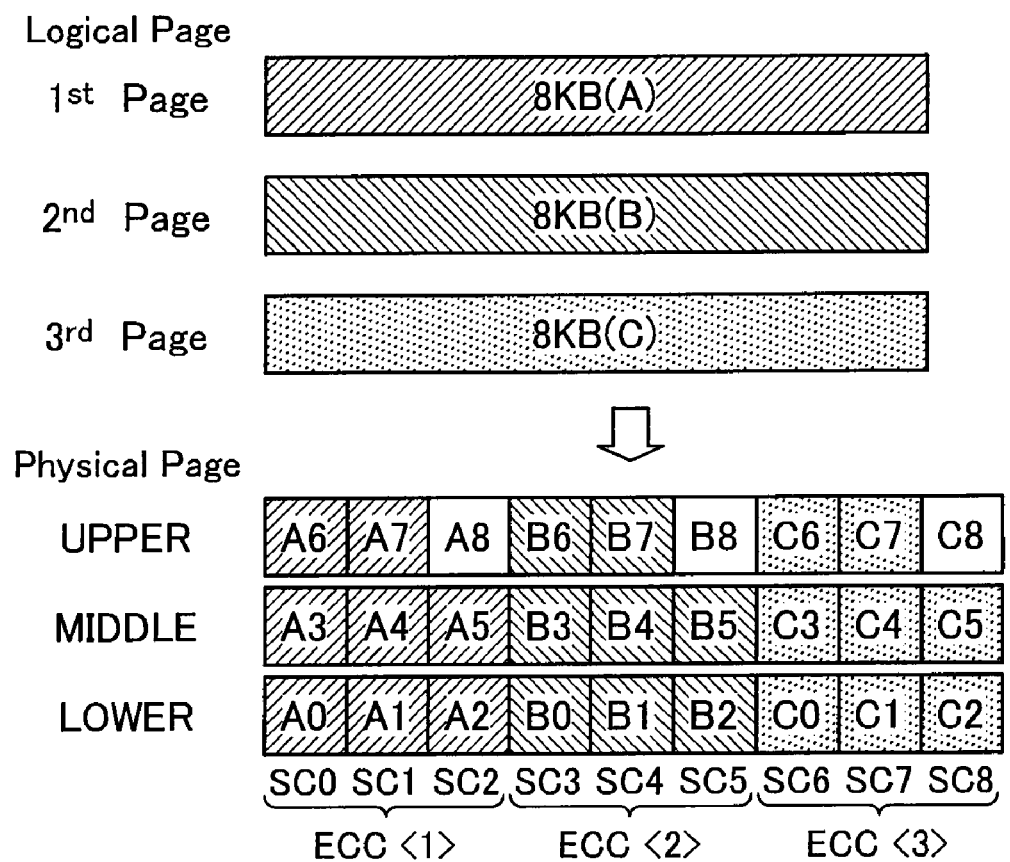
FIG. 9 is a view showing a relationship between data format of a logical page and a physical page in a nonvolatile memory in accordance with a second embodiment of the present invention.

FIG. 9 is a view showing a relationship between data format of a logical page and a physical page in a nonvolatile memory in accordance with a second embodiment of the present invention.

In the case of FIG. 9, there are three ECC frames <1>-<3>, similarly to the data format shown in FIG. 6.

The ECC frame <1> is configured by the information data A0-A7 and the redundant data A8 generated from the 8 KB of data A in the 1st page. These data A0, . . . , A8 are stored in the section <L0, L1, L2, M0, M1, M2, U0, U1, U2>. The ECC frame <2> is configured by the information data B0-B7 and the redundant data B8 generated from the 8 KB of data B in the 2nd page. These data B0, . . . , B8 are stored in the section <L3, L4, L5, M3, M4, M5, U3, U4, U5>. The ECC frame <3> is configured by the information data C0-C7 and the redundant data C8 generated from the 8 KB of data C in the 3rd page. These data C0, . . . , C8 are stored in the section <L6, L7, L8, M6, M7, M8, U6, U7, U8>.

Figure 10:
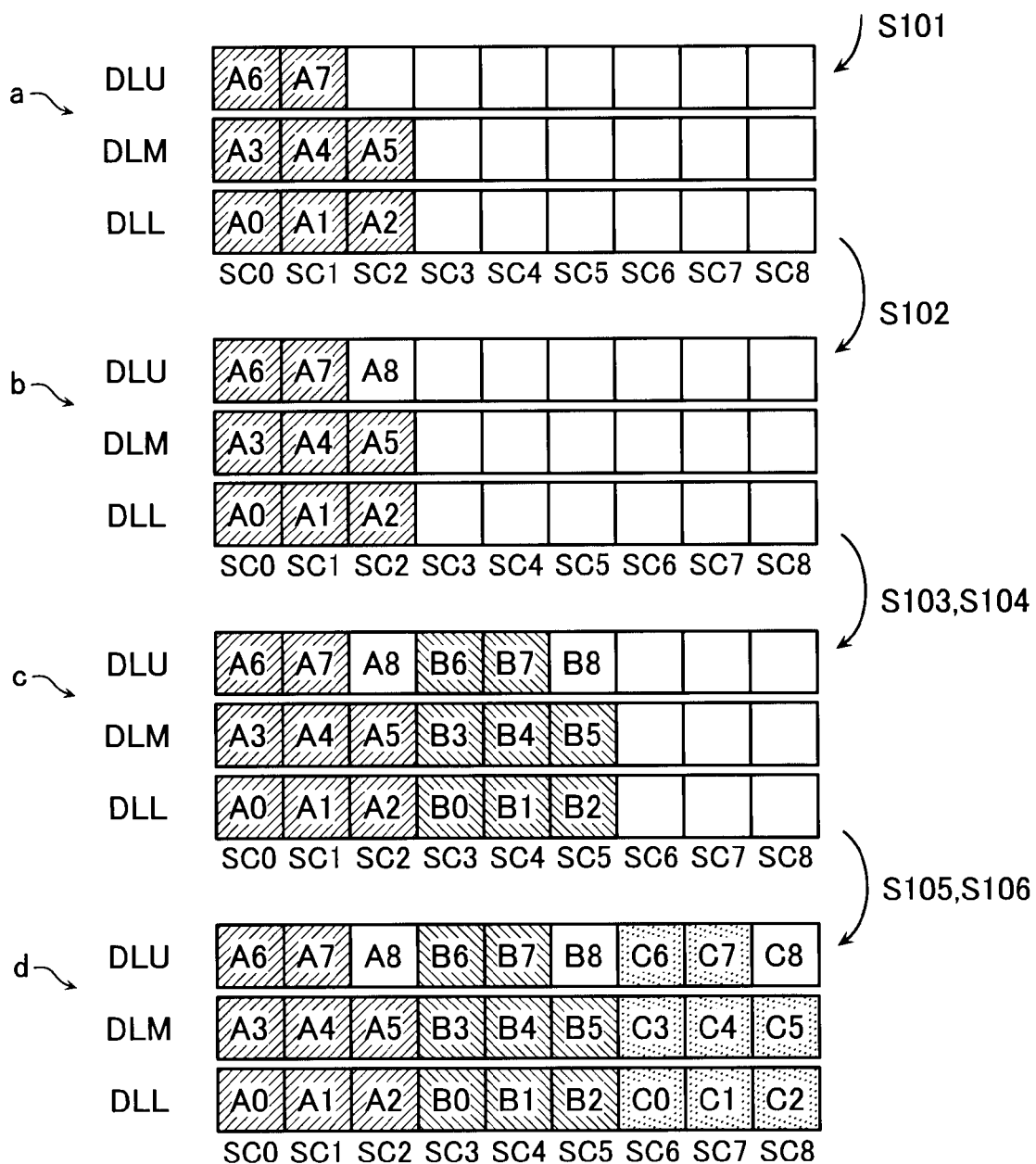
FIG. 10 is a view showing a state of data latches on a step-by-step basis for the control flow shown in FIG. 7 in the same embodiment.

A control flow for realizing the data format shown in FIG. 9 is similar to that in FIG. 7 and is therefore omitted. FIG. 10 is a view showing a state of the data latches DLU, DLM, and DLL on a step-by-step basis for this control flow.

First, in step S101, data A of the 1st page is inputted as information data A0-A7 into the sense amplifier/data latch unit 120, while in step S102, redundant data A8 is generated from the data A and this redundant data A8 is also inputted into the sense amplifier/data latch unit 120 following input of the information data A7. In the sense amplifier/data latch unit 120, the data latch signals DLLLAT, DLMLAT, and DLULAT applied to match timing of input of the data A0-A2, A3-A5, and A6-A8 are used to activate the data latches DLL, DLM, and DLU in the order of DLL, DLM, DLU and thereby receive the data A0-A8. States of the data latches DLU, DLM, and DLL subsequent to steps S101 and S102 are shown respectively in a and b of FIG. 10.

Next, in step S103, data B of the 2nd page is inputted as information data B0-B7 into the sense amplifier/data latch unit 120, while in step S104, redundant data B8 is generated from the data B and this redundant data B8 is also inputted into the sense amplifier/data latch unit 120 following input of the information data B7. In the sense amplifier/data latch unit 120, the data latch signals DLLLAT, DLMLAT, and DLULAT applied to match timing of input of the data B0-B2, B3-B5, and B6-B8 are used to activate the data latches DLL, DLM, and DLU in the order of DLL, DLM, DLU and thereby receive the data B0-B8. A state of the data latches DLU, DLM, and DLL subsequent to step S104 is shown in c of FIG. 10.

Then, in step S105, data C of the 3rd page is inputted as information data C0-C7 into the sense amplifier/data latch unit 120, while in step S106, redundant data C8 is generated from the data C and this redundant data C8 is also inputted into the sense amplifier/data latch unit 120 following input of the information data C7. In the sense amplifier/data latch unit 120, the data latch signals DLLLAT, DLMLAT, and DLULAT applied to match timing of input of the data C0-C2, C3-C5, and C6-C8 are used to activate the data latches DLL, DLM, and DLU in the order of DLL, DLM, DLU and thereby receive the data C0-C8. A state of the data latches DLU, DLM, and DLL subsequent to step S106 is shown in d of FIG. 10.

Subsequently, in step S107, a programming command is executed on the memory cell array 110, and, finally, in step S108, completion of this programming is awaited.

In the case of the first embodiment, the data latches DLL, DLM, and DLU are accessed on a single section basis in the order DLL, DLM, DLU. However, in the case of the present embodiment, the data latches DLL, DLM, and DLU are accessed on a three section basis in the order DLL, DLM, DLU. This kind of access sequence also allows the data format shown in FIG. 9 to be realized by the control flow in FIG. 7, simply by changing the activation timing of the data latch signals DLULAT, DLMLAT, DLLLAT and the bit select signals TIER0-TIER7.

Note that simply changing the activation timing of the data latch signals DLULAT, DLMLAT, DLLLAT and the bit select signals TIER0-TIER7 similarly to the present embodiment enables all kinds of data formats including the data formats in accordance with the first and second comparative examples to be efficiently realized.

Third Embodiment

A third embodiment of the present invention relates to a nonvolatile memory using a variable resistor.

Figure 11:
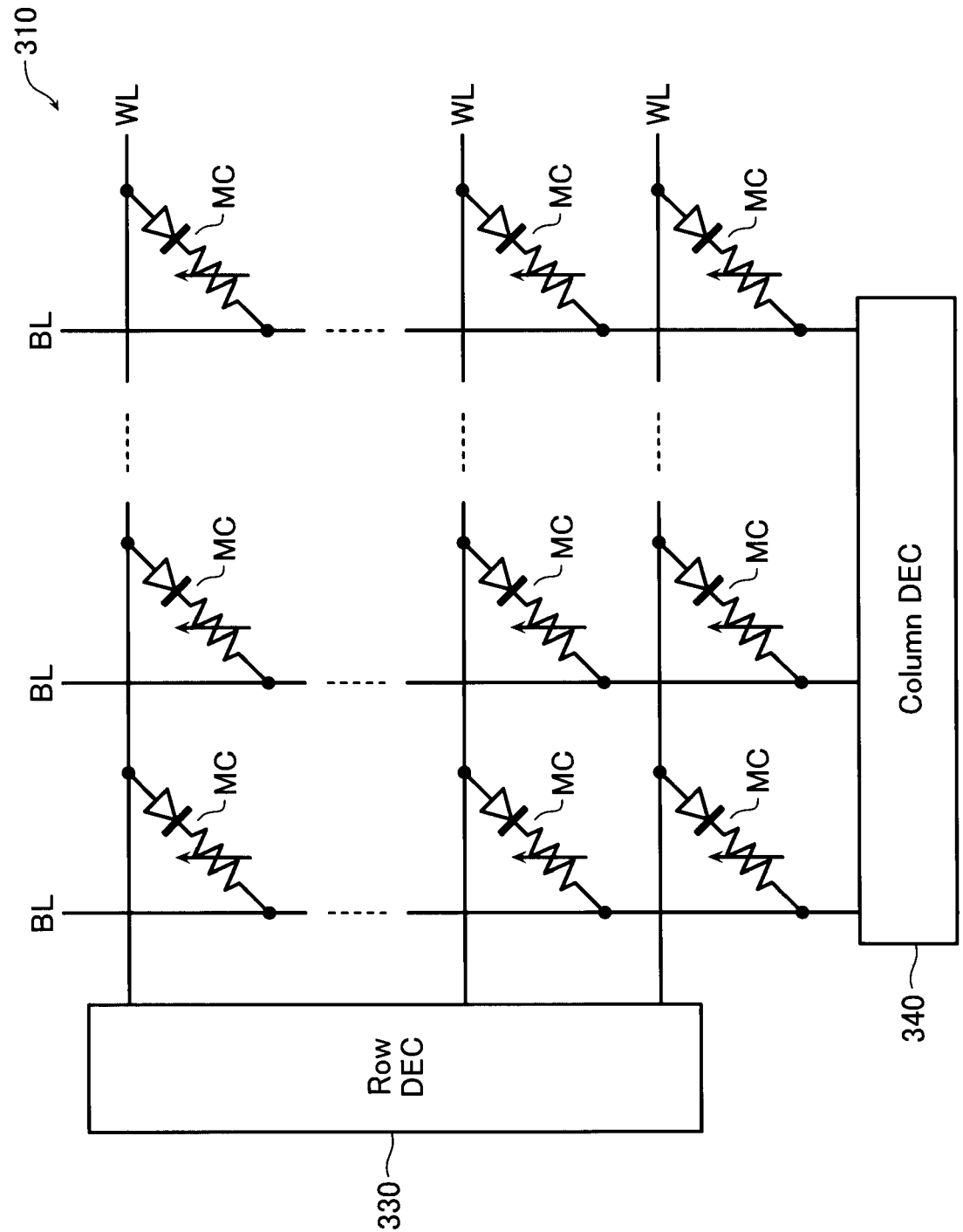
FIG. 11 is a view showing a configuration of a memory cell array of a nonvolatile memory in accordance with a third embodiment of the present invention.

FIG. 11 is a view showing a part of a nonvolatile memory in accordance with the present embodiment.

The nonvolatile memory of the present embodiment comprises a memory cell array 310 configured by a plurality of word lines WL which are first lines, a plurality of bit lines BL which are second lines and which intersect the plurality of word lines WL, and a plurality of memory cells MC one of which is connected to each of the intersection points of the word lines WL and bit lines BL. In addition, the nonvolatile memory of the present embodiment comprises a row decoder 330 disposed at one ends of the word lines WL and configured to select the word lines WL, and a column decoder 340 which is a column control unit and which is disposed at one ends of the bit lines BL and is configured to select the bit lines BL. This column decoder 340 has a similar function to the sense amplifier/data latch unit 120 and column decoder 140 of the NAND flash memory in accordance with the first embodiment, and the sense amplifiers SA and data latches DL also have a similar circuit configuration to that shown in FIG. 5.

Each of the memory cells MC is configured by a variable resistor having a resistance value which changes by applying an electrical stress, and a diode which is a non-ohmic element, the variable resistor and the diode being connected in series. In the case of the present embodiment, multilevel data can be stored by allocating multiple bits of data to the threshold distribution of resistance states of the variable resistor.

Figure 12:
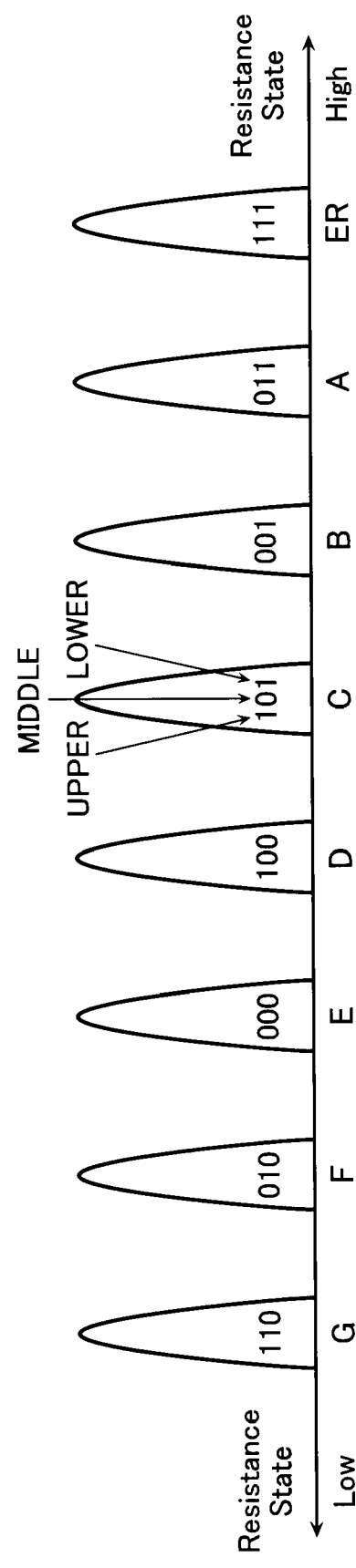
FIG. 12 is a view showing threshold distributions and a bit allocation pattern for each threshold distribution during 8-level storage in the same nonvolatile memory.

FIG. 12 is an example showing a relationship between threshold distributions of resistance states and a bit allocation pattern when 3-bit data is stored and when ReRAM is used as the variable resistor. In the case of ReRAM, a high resistance state which is an electrically stable state is assumed to be the erase state, and binary data "111", "011", "001", "101", "100", "000", "010", and "110" are respectively allocated from a threshold level ER of this erase state to a threshold level G which is in a lowest resistance state.

If a layer of data stored in the memory cells MC connected to an identical word line WL is assumed to be the L page, M page, or U page, and if the data provided by the host is assumed to be the logical page, then data format of the logical page and the physical page can also be handled in the nonvolatile memory having the above-described configuration, similarly to the first embodiment. The present nonvolatile memory thus also makes it possible to perform efficient handling of ECC frames using the control flow similar to the first embodiment.

In view of the above, the present embodiment makes it possible to obtain similar advantages to the first embodiment.

Other Embodiments

While certain embodiments of the invention have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

In each of the above-described embodiments, the case is described where one memory cell retains 3-bit data; however, similar advantages to the above-described embodiments can be obtained even for 2-bit data or data of 4 or more bits, simply by preparing only the same number of data latches for each column as the number of bits.

What is claimed is:

1. A nonvolatile semiconductor memory device, comprising:
a memory cell array configured by a plurality of first and second lines and a plurality of memory cells, each of the memory cells being selected by the first and second lines and being configured to store multiple-bit data in a nonvolatile manner, a first physical page being configured by a first bit of a plurality of the memory cells selected by one of the first lines, and a second physical page being configured by a second bit of the plurality of the memory cells selected by the one of the first lines, the second bit being different from the first bit;
a data bus configured to transmit write data to be written to the plurality of memory cells, the write data being configured by a plurality of unit data;
a column selection unit configured by a plurality of data latches, each of the data latches being configured to directly receive the unit data inputted from the data bus and to retain the unit data; and
a control unit configured to control activation/non-activation of the data latches,
wherein, during a programming operation, for each unit data inputted to the column selection unit, the control unit activates one of the data latches corresponding to a certain one of the memory cells where the unit data is to be stored, and
when, of the plurality of unit data included in one of the write data, a certain one of the unit data is assumed to be a first unit data, the unit data inputted into the column selection unit following said first unit data is assumed to be a second unit data, and the unit data inputted into the column selection unit after the second unit data is assumed to be a third unit data,
the first unit data is stored in the first physical page, the second unit data is stored in the second physical page, and the third unit data is stored in the first physical page.

2. The nonvolatile semiconductor memory device according to claim 1, wherein
the write data includes a plurality of ECC frames, each of the ECC frames having information data paired with redundant data generated on the basis of the information data,
each of the ECC frames is configured from a plurality of the unit data, and
data belonging to a certain one of the ECC frames is stored dispersed in the first physical page and the second physical page.

3. The nonvolatile semiconductor memory device according to claim 2, wherein
the redundant data of the certain one of the ECC frames is stored in the first physical page, and
the redundant data of others of the ECC frames is stored in the second physical page.

4. The nonvolatile semiconductor memory device according to claim 1, wherein
each of the memory cells is a transistor including a floating gate.

5. The nonvolatile semiconductor memory device according to claim 1, wherein
each of the memory cells is configured from a resistance varying element having a resistance value which changes due to electrical stress, and a non-ohmic element connected in series to the resistance varying element.

6. The nonvolatile semiconductor memory device according to claim 1, wherein
each of the data latches includes a plurality of bit latch circuits each configured to store one bit of data, a number of the bit latch circuits matching a length of the unit data, and
the control unit activates a certain one of the unit-data-length-matching number of bit latch circuits in a certain one of the plurality of data latches through a combination of a data latch signal and a bit selection signal, the data latch signal activating the certain one of the data latch circuits, and the bit selection signal selecting the certain one of the bit latch circuits.

7. The nonvolatile semiconductor memory device according to claim 1, wherein
the column selection unit includes a plurality of arithmetic units provided between the data latches and the second lines and configured to transfer the write data retained in the data latches via the second lines to the memory cells, and
one of the arithmetic units is shared by a certain number of the second lines.

8. A nonvolatile semiconductor memory device, comprising:
a memory cell array configured by a plurality of first and second lines and a plurality of memory cells, each of the memory cells being selected by the first and second lines and being configured to store multiple bits of data in a nonvolatile manner, a first physical page being configured by a first bit of a plurality of the memory cells selected by one of the first lines, and a second physical page being configured by a second bit of the plurality of the memory cells selected by the one of the first lines, the second bit being different from the first bit;
a data bus configured to transmit write data to be written to the plurality of memory cells, the write data being supplied from external;
a column selection unit including a first data latch and a second data latch corresponding respectively to a first bit and a second bit of the multiple bits of a certain one of the memory cells and each configured to store data contained in the data bus directly when activated, the column selection unit being configured to write the data stored in the first data latch and the second data latch to the first bit and the second bit, respectively; and
a control unit configured to activate the first data latch when write data supplied from external intended to be written to the first bit is supplied to the data bus, and to activate the second data latch when write data supplied from external intended to be written to the second bit is supplied to the data bus
wherein, when, of the plurality of unit data included in a certain one of the write data, a certain one of the unit data is assumed to be a first unit data, the unit data inputted into the column selection unit following said first unit data is assumed to be a second unit data, and the unit data inputted into the column selection unit after the second unit data is assumed to be a third unit data,
the column selection unit writes the first unit data in the first physical page, writes the second unit data in the second physical page, and writes the third unit data in the first physical page.

9. The nonvolatile semiconductor memory device according to claim 8, wherein
the write data includes a plurality of ECC frames, each of the ECC frames having information data paired with redundant data generated on the basis of the information data, and data belonging to a certain one of the ECC frames is stored dispersed in the first physical page and the second physical page.

10. The nonvolatile semiconductor memory device according to claim 9, wherein
the redundant data of the certain one of the ECC frames is stored in the first physical page, and
the redundant data of others of the ECC frames is stored in the second physical page.

11. The nonvolatile semiconductor memory device according to claim 8, wherein
each of the memory cells is a transistor including a floating gate.

12. The nonvolatile semiconductor memory device according to claim 8, wherein
each of the memory cells is configured from a resistance varying element having a resistance value which changes due to electrical stress, and a non-ohmic element connected in series to the resistance varying element.

13. The nonvolatile semiconductor memory device according to claim 8, wherein
the column selection unit includes a plurality of arithmetic units provided between the data latches and the second lines and configured to transfer the write data retained in the data latches via the second lines to the memory cells, and
one of the arithmetic units is shared by a certain number of the second lines.

14. A nonvolatile semiconductor memory device, comprising:
a memory cell array configured by a plurality of first and second lines and a plurality of memory cells, each of the memory cells being selected by the first and second lines and being configured to store multiple-bit data in a nonvolatile manner, a first physical page being configured by a first bit of a plurality of the memory cells selected by one of the first lines, a second physical page being configured by a second bit of the plurality of memory cells selected by the certain one of the first lines, the second bit being another bit differing from the first bit, one column being configured by a certain number of the second lines;
a data bus configured to transmit write data to be written to the plurality of memory cells, the write data being supplied from external and being configured by a plurality of unit data, the number of unit data corresponding to a length of the column; and
a column selection unit including a first data latch and a second data latch for each column, the first data latch being configured to retain the unit data to be written to the first bit of a certain number of the memory cells belonging to the first physical page and to a certain column, the second data latch being configured to retain the unit data to be written to the second bit of the certain number of the memory cells belonging to the second physical page and to the certain column,
when, of the plurality of unit data included in one of the write data, a certain one of the unit data is assumed to be a first unit data, the unit data inputted into the column selection unit following said first unit data is assumed to be a second unit data, and the unit data inputted into the column selection unit after the second unit data is assumed to be a third unit data,
the column selection unit retaining the first unit data using the first data latch of a certain column, retaining the second unit data using the second data latch of the identical column, and retaining the third unit data with the first data latch of another column.

15. The nonvolatile semiconductor memory device according to claim 14, wherein
the write data includes a plurality of ECC frames, each of the ECC frames having information data paired with redundant data generated on the basis of the information data, each of the ECC frames is configured from a plurality of the unit data, and data belonging to a certain one of the ECC frames is stored dispersed in a first physical page and a second physical page.

16. The nonvolatile semiconductor memory device according to claim 15, wherein the redundant data of the certain one of the ECC frames is stored in the first physical page, and the redundant data of others of the ECC frames is stored in the second physical page.

17. The nonvolatile semiconductor memory device according to claim 14, wherein each of the memory cells is a transistor including a floating gate.

18. The nonvolatile semiconductor memory device according to claim 14, wherein each of the memory cells is configured from a resistance varying element having a resistance value which changes due to electrical stress, and a non-ohmic element connected in series to the resistance varying element.

19. The nonvolatile semiconductor memory device according to claim 14, wherein each of the data latches includes a plurality of bit latch circuits each configured to store one bit of data, a number of the bit latch circuits matching a length of the unit data, and the control unit activates a certain one of the unit-data-length-matching number of bit latch circuits in a certain one of the plurality of data latches through a combination of a data latch signal and a bit selection signal, the data latch signal activating the certain one of the data latch circuits, and the bit selection signal selecting the certain one of the bit latch circuits.

20. The nonvolatile semiconductor memory device according to claim 14, wherein the column selection unit includes a plurality of arithmetic units provided between the data latches and the second lines and configured to transfer the unit data retained in the data latches via the second lines to the memory cells, and one of the arithmetic units is shared by the second lines belonging to one column.

* * * * *